United States Patent
Chiba et al.

(10) Patent No.: US 6,677,516 B2
(45) Date of Patent: Jan. 13, 2004

(54) PHOTOVOLTAIC CELL AND PROCESS FOR PRODUCING THE SAME

(75) Inventors: Yasuo Chiba, Kitakatsuragi-gun (JP); Masafumi Shimizu, Kitakatsuragi-gun (JP); Liyuan Han, Kitakatsuragi-gun (JP); Ryohsuke Yamanaka, Gojyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/058,060

(22) Filed: Jan. 29, 2002

(65) Prior Publication Data

US 2002/0134426 A1 Sep. 26, 2002

(30) Foreign Application Priority Data

Jan. 29, 2001 (JP) ........................................ 2001-019585
Jan. 18, 2002 (JP) ........................................ 2002-010153

(51) Int. Cl.[7] ........................ H01L 31/0256; H01L 31/04
(52) U.S. Cl. ........................ 136/263; 136/252; 136/256; 136/255; 136/249; 257/440; 257/40; 438/74; 438/70; 438/82; 438/85; 438/99
(58) Field of Search ........................ 136/263, 252, 136/256, 255, 249; 257/440, 40; 438/74, 70, 82, 85, 99

(56) References Cited

U.S. PATENT DOCUMENTS

| | | | | |
|---|---|---|---|---|
| 5,885,368 A | * | 3/1999 | Lupo et al. | 136/263 |
| 6,150,605 A | * | 11/2000 | Han | 136/263 |
| 6,300,559 B1 | * | 10/2001 | Ohmori | 136/263 |
| 6,310,282 B1 | * | 10/2001 | Sakurai et al. | 136/263 |
| 6,559,375 B1 | * | 5/2003 | Meissner et al. | 136/263 |
| 2002/0108649 A1 | * | 8/2002 | Fujimori et al. | 136/263 |
| 2002/0117201 A1 | * | 8/2002 | Nelles et al. | 136/263 |

FOREIGN PATENT DOCUMENTS

| | | |
|---|---|---|
| JP | 58-188169 A | 11/1983 |
| JP | 59-124772 A | 7/1984 |
| JP | 1-220380 A | 9/1989 |
| JP | 1-289173 A | 11/1989 |
| JP | 2000-90989 A | 3/2000 |
| JP | 2000-243466 A | 9/2000 |
| JP | 2001-76772 A | 3/2001 |
| WO | 94/05025 A1 | 3/1994 |

OTHER PUBLICATIONS

Pichot et al, Langmuir, vol. 17, pp. 5626–5630, (2000).*
He et al, Langmuir, ASAP Article 10.1021/1a020639b, Web release date Feb. 7, 2003.*
Nazeeruddin et al, "Conversion of Light to Electricity by cis–$X_2$Bis(2,2'–bipyridyl–4,4'–dicarboxylate)ruthenium(II) Charge–Transfer Sensitizers (X—Cl–, Br–, I–, CN–, and SCN–) on Nanocrystalline $TiO_2$ Electrodes", *J. Am. Soc.*, vol. 115, No. 14, 1993, pp. 6382–6390.

\* cited by examiner

*Primary Examiner*—Alan Diamond
(74) *Attorney, Agent, or Firm*—Nixon & Vanderhye P.C.

(57) ABSTRACT

A dye-sensitized photovoltaic cell comprising an electroconductive support, a porous photovoltaic layer constituted with a porous semiconductor layer containing a photosensitizing dye, a hole transporting layer, and a support on a counter electrode side, the porous photovoltaic layer having a multi-layer structure, and the semiconductor layer having a haze ratio at a wavelength in a visible light region of 60% or more.

17 Claims, 2 Drawing Sheets

PHOTOVOLTAIC CELL AND PROCESS FOR PRODUCING THE SAME

CROSS-REFERENCE TO RELATED APPLICATIONS

This application is related to Japanese Patent Applications Nos. 2001-019585 filed on Jan. 29, 2001, and 2002-10153 filed on Jan. 18, 2002 whose priorities are claimed under 35 USC §119, the disclosure of which is incorporated by reference in its entirety.

BACKGROUND OF THE INVENTION

1. Field of the Invention

The present invention relates to a photovoltaic cell, a process for producing the same and a process for producing a solar cell using the same.

2. Description of the Related Art

A solar cell utilizing sunlight is receiving attention as an alternative energy source instead of biofuel, and various investigations have been carried out. The mainstream of solar cells that are currently subjected to practical includes a cell formed with a polycrystalline silicon substrate and a cell formed with amorphous silicon. The former is high in production cost, and a large amount of energy is consumed in the production process thereof. The later is high in production cost, and semiconductor gas materials, which involve difficulty on handling, are necessarily used in the production process thereof.

Japanese Unexamined Patent Publication Nos. Sho 58 (1983)-88169, Sho 59 (1984)-124772 and Hei 1 (1989)-289173 disclose those silicon solar cells, in which solar cells having different absorption spectra are accumulated on the same substrate. However, the solar cells cannot solve the foregoing problems.

A dye-sensitized solar cell is receiving attention as an alternative solar cell instead of the silicon solar cells.

The basic structure of the dye-sensitized solar cell includes a transparent electrode, a porous photovoltaic layer, a hole transporting layer and a counter electrode. One or two kinds of photosensitizing dyes having absorption spectra in the visible light region are adsorbed on the surface of the semiconductor of the porous semiconductor layer having a single layer structure. Upon operation of the solar cell, the porous photovoltaic layer is irradiated with light to generate electrons on the side of the porous photovoltaic layer, and the electrons migrate to the counter electrode through an electric circuit. The electrons migrating to the counter electrode are transported with ions in an electrolyte to go back into the porous photovoltaic layer. The process is repeated to take out electric energy. Japanese Patent No. 2,664,194 and WO94/05025 disclose dye-sensitized solar cells utilizing migration of light-induced electrons of a metallic complex.

However, in the case where the sensitizing dye disclosed in Japanese Patent No. 2,664,194 is used, the absorption wavelength range of the dye used for photovoltaic conversion is narrower than the spectrum of sunlight, and sunlight cannot be effectively utilized, whereby it provides a low photovoltaic efficiency in comparison to the silicon solar cells. In order to solve the problem, Japanese Unexamined Patent Publication No. 2001-76772 discloses an improvement of the short circuit electric current density (Jsc) by controlling the particle diameter of titanium oxide. However, according to J. Am. Chem. Soc., vol. 115, pp. 6382–6390 (1993), in the case where the external quantum efficiency of the dye-sensitized solar cell exceeds 80%, the internal quantum efficiency exerts a value approaching 100% taking such factors as transmission, reflection and scattering by glass into consideration. This means that there is a limit to improve the external quantum efficiency due to scattering. Consequently, there is no means to obtain a higher value of Jsc other than expansion of the photosensitivity range of the dye.

In order to expand the photosensitivity range of the dye, Japanese Unexamined Patent Publication No. 2000-243466 discloses a dye-sensitized solar cell using two dyes. In Japanese Unexamined Patent Publication No. 2000-243466, a film is formed after adsorbing a photosensitizing dye on titanium oxide fine particles, and the operation is repeated to produce the solar cell. However, because a baking step is not carried out in the production process, electroconductivity among titanium oxide particles is greatly impaired, and carriers formed by irradiation light cannot effectively reach the electrode, whereby no photovoltaic current can be taken out. In the production process of Japanese Unexamined Patent Publication No. 2000-243466, furthermore, because the semiconductor layers constituting the multi-layer structure are formed in the similar production process, light taken on the light receiving surface is uniformly scattered in the first layer and the second and subsequent layers. Therefore, the amount of light that is taken in the second and subsequent layers of the porous semiconductor layer is decreased due to scattering by the first semiconductor layer, and it is difficult that an electric current is effectively taken out from the second and subsequent semiconductor layers.

SUMMARY OF THE INVENTION

An object of the present invention is to provide a photovoltaic cell of high efficiency by applying a multi-layer structure to an oxide semiconductor layer and controlling the haze ratio of the multi-layered oxide semiconductor layer over a prescribed value so as to improve Jsc and by differentiating the particle diameters of semiconductor fine particles between the first and second layers of the multi-layered semiconductor layer in such a manner that the first layer has a smaller or a uniform particle diameter for suppressing light scattering and the second layer scatter light sufficiently for taking light in high efficiency. Objects of the invention are also to provide a dye-sensitized photovoltaic cell that can conduct photovoltaic conversion of light of a wide range of spectrum from the visible region to the near infrared light region in the sunlight spectrum and to provide a photovoltaic cell having a high efficiency by improving Jsc. These photovoltaic cells can be used as solar cells of low cost.

In order to accomplish the invention, the inventors have made intensive study and found the following. A multi-layer structure is applied to a porous semiconductor layer of a photovoltaic layer, and the haze ratio thereof is controlled over a prescribed value, so as to improve Jsc. In the case where the porous semiconductor layer has a two-layer structure, the particle diameters in the first and second layers are differentiated from each other. That is, light scattering is suppressed in the first layer by using semiconductor fine particles having a small particle diameter or a uniform particle diameter, whereas semiconductor fine particles exerting light scattering are used in the second layer, so as to take the light in the second layer in high efficiency to provide a photovoltaic cell of high efficiency. The term "haze ratio" used herein means a "haze value (%)" as a standard for light transmittance, which is defined in JIS K6714.

The invention provides a dye-sensitized photovoltaic cell containing an electroconductive support, a porous photovoltaic layer constituted with a porous semiconductor layer containing a photosensitizing dye, a hole transporting layer, and a support on a counter electrode side, the porous photovoltaic layer having a multi-layer structure, and the semiconductor layer having a haze ratio at a wavelength in a visible light region of 60% or more.

The invention also provides a dye-sensitized photovoltaic cell containing an electroconductive support, a porous photovoltaic layer constituted with a porous semiconductor layer containing a photosensitizing dye, a hole transporting layer, and a support on a counter electrode side, the porous photovoltaic layer having a multi-layer structure, a process for producing the same, and a solar cell using the same.

The invention further provides a dye-sensitized photovoltaic cell, in which respective layers of the porous photovoltaic layer having a multi-layer structure are arranged in an order, from a light receiving surface, from a layer having a maximum sensitivity wavelength region on a short wavelength side in the absorption spectrum to a layer having a maximum sensitivity wavelength region on a long wavelength side in the absorption spectrum.

The invention still further provides a dye-sensitized photovoltaic cell, in which particles constituting the respective layers of the porous photovoltaic layer having a multi-layer structure have different particle diameters.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
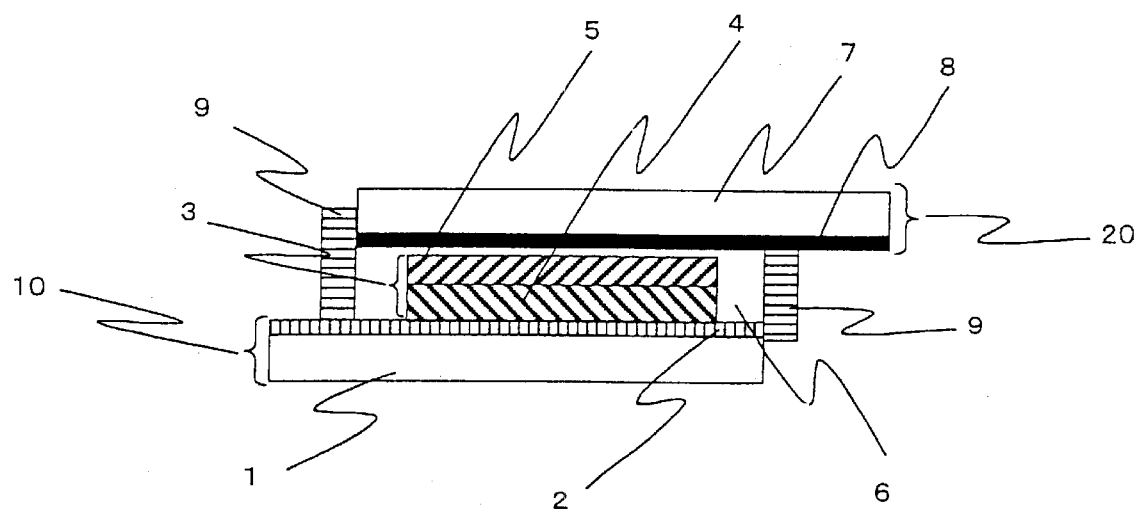
FIG. 1 is a cross sectional view showing an embodiment of a dye-sensitized photovoltaic cell according to the invention.

The photovoltaic cell of the invention is formed by accumulating an electroconductive support, a porous photovoltaic layer, an electroconductive layer and a support on a counter electrode side in this order.

An embodiment of the invention will be described with reference to FIG. 1. A dye-sensitized solar cell shown in FIG. 1 has such a structure containing an electroconductive support 10 having formed thereon a porous photovoltaic layer 3 having a photosensitizing dye adsorbed thereon and/or therein, a hole transporting layer 6 filled between the porous photovoltaic layer 3 and a support on a counter electrode side 20, and a sealant 9 sealing the side surfaces. The porous photovoltaic layer 3 has a multi-layer structure containing a first porous photovoltaic layer 4 and a second porous photovoltaic layer 5, in which a photosensitizing dye having a maximum sensitivity wavelength region on a short wavelength side is adsorbed on the first porous photovoltaic layer 4, and a photosensitizing dye having a maximum sensitivity wavelength region on a long wavelength side is adsorbed on the second porous photovoltaic layer 5.

The electroconductive support 10 is constituted with a substrate 1 and a transparent electroconductive film 2.

The material used in the substrate 1 is not particularly limited and can be various kinds of transparent materials, and glass is preferably used. The material used in the transparent electroconductive film 2 is also not particularly limited, and it is preferred to use a transparent electroconductive metallic oxide electrode such as fluorine-doped tin oxide ($SnO_2$:F), antimony-doped tin oxide ($SnO_2$:Sb), tin-doped indium oxide ($In_2O_3$:Sn), aluminum-doped zinc oxide (ZnO:Al) and gallium-doped zinc oxide (ZnO:Ga). Examples of the method for forming the transparent electroconductive film 2 on the substrate 1 include a vacuum vapor deposition method, a sputtering method, a CVD (Chemical Vapor Deposition) method and a PVD (Physical Vapor Deposition) method using a component of the material, and a coating method by a sol-gel method.

The material of the porous semiconductor layer used in the porous photovoltaic layer 3 is not particularly limited as far as it is an n type semiconductor. It is preferred to use an oxide such as $TiO_2$, $SnO_2$, ZnO, $Nb_2O_5$, $ZrO_2$, $CeO_2$, $WO_3$, $SiO_2$, $Al_2O_3$, $CuAlO_2$, $SrTiO_3$ and $SrCu_2O_2$, or a complex oxide containing plurality of these oxides.

The porous photovoltaic layer 3 has a multi-layer structure. The multi-layer structure herein means such a structure that is formed by accumulating the same or different porous semiconductor layers, in which dyes having different maximum sensitivity wavelength regions are adsorbed on the layers, respectively. The maximum sensitivity wavelength region herein means, in a peak wavelength showing the maximum absorption sensitivity in the absorption spectrum of the dye, a wider one of a wavelength region between a short wavelength and a long wavelength, on which the absorption sensitivity is decreased by 20% from the absorption sensitivity of the peak wavelength, and a wavelength region between ±50 nm with respect to the peak wavelength. In order to carry out photovoltaic conversion of light by a dye-sensitized solar cell with high efficiency, the layer having a maximum sensitivity wavelength region on a short wavelength side to the layer having a maximum sensitivity wavelength region on a long wavelength side are arranged in this order from the light receiving surface, whereby light that cannot be absorbed by the maximum sensitivity wavelength region on a short wavelength side can be absorbed by the dye having a maximum sensitivity wavelength region on a long wavelength side. There is nothing to say that when the layers having different maximum sensitivity wavelength regions are accumulated, the effect of the invention is exerted even though the regions overlap each other.

In order that the dye thoroughly absorbs the light, the porous photovoltaic layer having a multi-layer structure preferably has a haze ratio at a wavelength in a visible light region of 60% or more. The haze ratio herein is a value obtained by dividing a diffusion transmittance by a total light transmittance when a light ray having a spectrum in the visible light region (for example, the standard light source D65 and the standard light source C) is incident, and can be measured by irradiating the porous photovoltaic layer formed on the transparent support with the light ray on the side of the porous photovoltaic layer to measure the total light transmittance and the diffusion transmittance. The measurement is a simple evaluation method, which can be easily carried out only with a light source and an actinometer. Upon practical measurement, it can be measured with an apparatus having an integrating sphere in contact with a measurement sample, and a light trap (camera obscura) or a standard plate on the side of the integrating sphere opposite to the measurement sample. That is, under the state where the standard plate is set, a light amount T1 of an incident light ray with no sample and a light amount T2 of an incident light with a sample present are measured, and under the state where the light trap is set, a light amount T3 of diffused light from the apparatus with no sample and a light amount T4 of diffused light with the sample present are measured. The total light transmittance Tt and the diffusion transmittance Td are calculated by the following equations, and the haze ratio can be obtained from Td/Tt.

$$Tt=T2/T1$$

$$Td=(T4-T3(T2/T1))/T1$$

Figure 2:
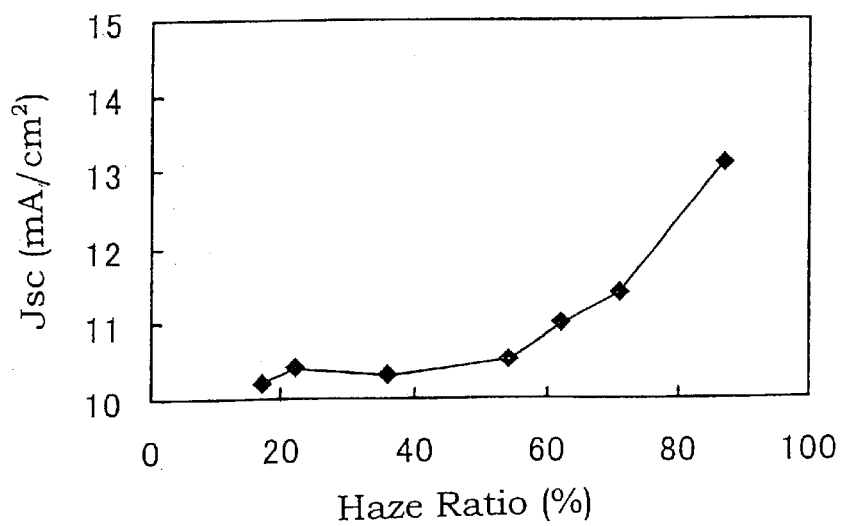
FIG. 2 is a graph showing the dependency of Jsc on the haze ratio.

The reason why the haze ratio is preferably 60% or more can be ascribed to the fact that the improvement of Jsc is conspicuous under the conditions. The conditions have been obtained as a result of repeated experiments by the inventors for forming the porous photovoltaic layer having a multi-layer structure with controlling the haze ratio. FIG. 2 shows the haze ratio dependence of Jsc. While it will be described in detail later in examples, a solar cell using the porous photovoltaic layer having a multi-layer structure is produced, and results of the measurement of Jsc and the haze ratio are shown in FIG. 2. As shown in FIG. 2, it is found that the values of Jsc on a haze ratio of 60% or more are improved in comparison to the values of Jsc on a haze ratio of from 20 to 50%. This is because the number of irradiation of light on the photosensitizing dye and the haze ratio is not in a simple proportionality relationship, but the number of irradiation of light on the photosensitizing dye is further increased with the haze ratio being increased, and thus the number of irradiation of light on the photosensitizing dye is exponentially increased in a range of a haze ratio of 60% or more. Consequently, a large amount of electric current can be obtained by controlling the haze ratio of the porous photovoltaic layer to 60% or more.

In the porous photovoltaic layer having a multi-layer structure, the first porous photovoltaic layer contains the dye of the short wavelength side, and the second porous photovoltaic layer contains the dye of the long wavelength side, as described in the foregoing. Owing to the configuration, it is preferred that light other than light absorbed by the dye adsorbed on the first layer is not scattered by the first porous photovoltaic layer as possible but arrives at the second layer. Furthermore, scattering is carried out in the second porous photovoltaic layer to take out a larger amount of electric current. Therefore, the second and subsequent photovoltaic layers preferably has a larger haze ratio than the first layer in order that the light is liable to arrive at the second and subsequent photovoltaic layers. In order to realize the conditions, it is possible that the particle diameter in the first porous semiconductor layer and the particle diameter in the second porous semiconductor layer are different from each other. This can be explained by the following theory. Light has a property of rectilinear propagation when no barrier is present. When a porous semiconductor layer having a small particle diameter is formed as the first layer, light can be transmitted without significant scattering owing to the small particle diameter. This is because the diffraction angle of light is small due to the small particles, and thus there is no significant decrease of the amount of light that is transmitted through the porous semiconductor layer. At this time, when a porous semiconductor layer having a large particle diameter is formed as the second layer, the diffraction angle of light herein is large due to the large particles, and thus the amount of light that is transmitted through the porous semiconductor layer is greatly decreased. Consequently, light can be taken in the second layer by the particle diameters of the respective layers that are different from each other.

As described in the foregoing, in the porous photovoltaic layer having a multi-layer structure, it is preferred that light is not scattered by the first layer as possible and arrives at the second layer, and thus the haze ratio of the first porous photovoltaic layer at a wavelength in the visible region is preferably 20% or less, and more preferably 10% or less. It is preferred that light is sufficiently scattered in the second porous photovoltaic layer, and thus the haze ratio of the second porous photovoltaic layer is preferably 60% or more, and more preferably 70% or more.

The haze ratios in FIG. 2 are measured after forming the porous semiconductor layer having a multi-layer structure as described later in the examples. In order to measure the haze ratios of the first layer and the second layer, the respective layers are necessarily released from the porous semiconductor layer having been formed as a multi-layer structure, but evaluation of haze ratios in this manner is difficult. Results obtained by measuring the haze ratio of the first layer and the haze ratio of the second layer separately from each other exhibit no significant difference from results obtained by measuring the haze ratios of the first layer and the second layer having been formed as a multi-layer structure. This is because the first porous semiconductor layer has a smaller haze ratio than the second porous semiconductor layer by controlling the particle diameter, and therefore, the haze ratio of the porous semiconductor layer having a multi-layer structure is substantially determined by the haze ratio of the second porous semiconductor layer. Accordingly, while the haze ratios may be measured for the respective layers separately, it is more preferred that the haze ratios be measured for the porous semiconductor layer having a multi-layer structure.

As described in the foregoing, the second and subsequent layers of the photovoltaic layers have sensitivities to light of a long wavelength. In general, because particles having a certain particle diameter scatter light having a wavelength of several times the particle diameter, it is preferred to use particles having a small particle diameter in the first photovoltaic layer in order to suppress scattering of light of a long wavelength. This is because of the reasons described in the foregoing. Furthermore, the particle diameter is preferably uniform. The uniform particle diameter herein means that 80% of the particles used have particle diameters within the range of from 50 to 200% of the average particle diameter. More preferably, 90% of the particles used have particle diameters within the range of from 50 to 200% of the average particle diameter.

In the invention, the haze ratio of the porous photovoltaic layer can be controlled by changing the mixing ratio of particles having different particle diameters and by changing the particle diameters. It is preferred that particles having a particle diameter of four times or more the particle diameter of the semiconductor particles in the first porous photovoltaic layer are used in the second and subsequent layers. More preferably, particles having a particle diameter of ten times or more are used. In this case, 20% or more of the particles used may be the larger ones.

In the case where it is difficult to obtain particles having a larger diameter, those having large secondary particles through aggregation may be used. For example, titania particles for photocatalysts produced by the precipitation method (containing primary particles having a diameter of from 20 to 30 nm and secondary particles having a diameter of several hundreds nm to several $\mu$m) may be used, and these particles may be added to particles having a small diameter.

As a method for forming the porous semiconductor layer constituting the porous photovoltaic layer in a film form on the substrate, various kinds of known methods may be used. Specific examples thereof include a method, in which a suspension containing semiconductor particles is coated on the substrate, and then dried and baked, a method, in which the semiconductor film is formed on the substrate by a CVD method or a MOCVD (Metal Organic Chemical Vapor Deposition) method using a raw material gas, and a method, in which the semiconductor film is formed on the substrate by a PVD method, a vacuum vapor deposition method and a sputtering method using a raw material solid, and a sol-gel method or an electrochemical method such as an electrodeposition method. The film thickness of the semiconductor layer is not particularly limited and is preferably about from 0.5 to 20 $\mu$m from the standpoint of transmissibility and conversion efficiency. Among the foregoing methods, the method, in which a suspension containing semiconductor particles is coated, and then dried and baked, is preferred for reducing the production cost.

The first porous semiconductor layer can be formed in the following manner. Semiconductor fine particles as a raw material are prepared, and the semiconductor fine particles are added to and dispersed in a dispersant, an organic solvent or water to prepare a suspension, which is then coated on the electroconductive support 10. As the coating method, the known methods such as a doctor blade method, a squeegee method, a spin coating method and a screen printing method, can be used. Thereafter, the porous semiconductor layer is dried and baked. Upon drying and baking the semiconductor layer, it may be necessary that the temperature, the time and the atmosphere be adjusted depending on the kinds of the substrate and the semiconductor particles used. For example, the operation can be carried out in the air or under an inert gas atmosphere at a temperature of about from 50 to 800° C. for about from 10 seconds to 12 hours. The drying and baking operation may be carried out once at a single temperature or by twice or more at various temperatures.

Examples of the semiconductor particles include commercially available particles of a single element semiconductor or a compound semiconductor having an appropriate average particle diameter, for example, about from 1 to 500 nm. Examples of the solvent, in which the semiconductor particles are dispersed, include grime solvents such as ethylene glycol monomethyl ether, alcohol solvents such as isopropyl alcohol and terpineol, mixed solvents such as isopropyl alcohol/toluene, and water.

According to the foregoing various methods, the first porous semiconductor layer having a uniform particle diameter can be produced by using semiconductor fine particles having a uniform particle diameter. The haze ratio of the first layer can be controlled by changing the dispersion time and by mixing particles having a larger particle diameter of the same material as or a different material from the porous semiconductor layer.

Figure 3:
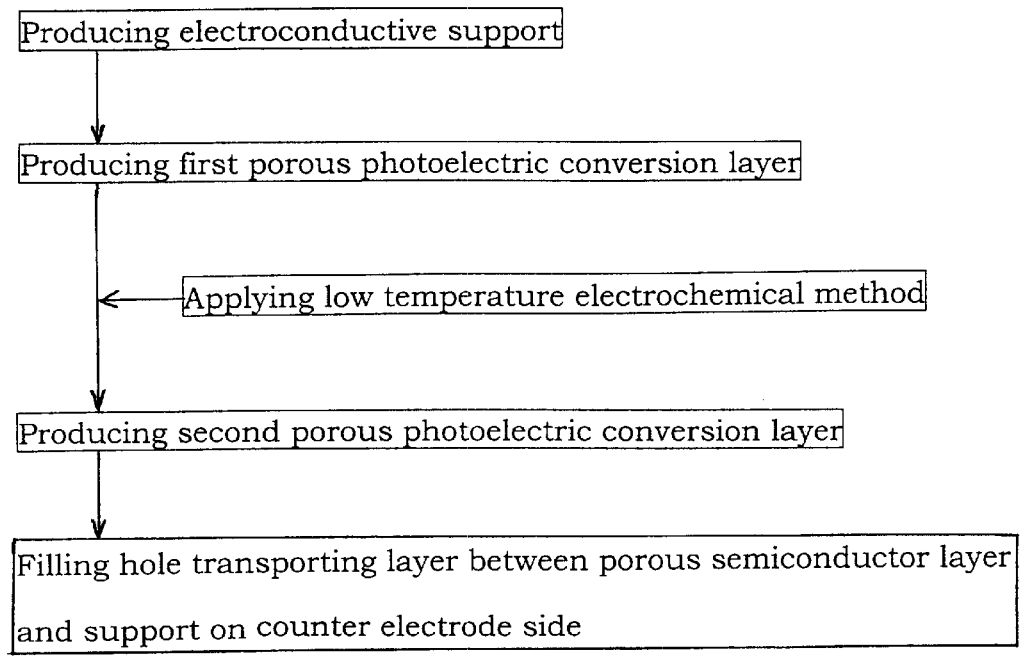
FIG. 3 is a flow chart showing an outline of an embodiment of a process for producing a dye-sensitized photovoltaic cell according to the invention.

An outline of the process for producing a dye-sensitized solar cell will be described with reference to the flow chart shown in FIG. 3, and then the production process will be described in more detail. The numerals referred herein correspond to those in FIG. 1.

A transparent electroconductive film 2 is formed on a substrate 1 to produce an electroconductive support 10. A first porous photovoltaic layer 4 is produced on the electroconductive support 10 on a side of the transparent electroconductive film 2. As the production method of the first porous photovoltaic layer, a low temperature electrochemical method may or may not be applied. In the case where the low temperature electrochemical method is applied, a photosensitizing dye is simultaneously adsorbed on the first porous photovoltaic layer, and a photosensitizing dye may not be additionally adsorbed. In the case where the low temperature electrochemical method is not applied, on the other hand, because it is necessary that a photosensitizing dye be separately adsorbed, a photosensitizing dye may be adsorbed after producing the first porous photovoltaic layer.

After producing the first porous photovoltaic layer 4, a second porous photovoltaic layer 5 is produced. Regardless of whether or not the low temperature electrochemical method is applied to the production method of the first porous photovoltaic layer 4, the second porous photovoltaic layer 5 is necessarily produced at a low temperature, and the temperature upon production is preferably 200° C. or less. When the second porous photovoltaic layer is produced at a temperature exceeding 200° C., the dye contained in the first porous photovoltaic layer is decomposed. As the low temperature forming method, the low temperature electrochemical method can be applied to the production. At this time, because the dye has been supported on the first porous photovoltaic layer, the second porous photovoltaic layer is produced at a temperature lower than the decomposition temperature of the dye by utilizing the low temperature electrochemical method, whereby the multi-layer porous photovoltaic layer having the desired dyes supported on the respective layers can be stably and conveniently produced without impairing the photovoltaic function of the first porous photovoltaic layer.

Examples of the low temperature production method other than the low temperature electrochemical method include a hydrothermal method. The hydrothermal method is such a production method in that a film is coated on an electroconductive support by using a metallic alkoxide, followed by drying at a low temperature, and then the assembly is immersed in boiling water along with the glass substrate. The low temperature electrochemical method is such a production method in that a metallic nitrate solution is electrochemically reduced. It is preferred that the second porous semiconductor layer is produced by using the electrochemical method.

The electrochemical method is such a production method in that a metallic nitrate solution is electrochemically reduced. In this method, a metallic nitrate solution is electrochemically reduced to form a porous photovoltaic layer of a metallic oxide adsorbing a photosensitizing dye. Examples of the metallic oxide include zinc oxide. As the solution used for the electrochemical reduction reaction, a zinc nitrate aqueous solution having a photosensitizing dye mixed therein is used. In the case where the second porous photovoltaic layer is produced, a photosensitizing dye different from that used in the first layer is used, and the operation is repeated, whereby a porous photovoltaic layer of a metallic oxide adsorbing a photosensitizing dye can be formed.

The transparent electroconductive film, a counter electrode and a reference electrode are put in the mixed solution of zinc nitrate and the dye, and an electrolytic reaction is carried out, whereby zinc oxide is formed on the transparent electroconductive film according to the following reaction formulae.

$$NO_3^- + H_2O + 2e^- \Rightarrow NO_2^- + 2OH^- \qquad (1)$$

$$Zn^{2+} + 2OH^- \Rightarrow Zn(OH)_2 \qquad (2)$$

$$Zn(OH)_2 \Rightarrow ZnO + H_2O \qquad (3)$$

As shown by the reaction formulae, the formation of zinc oxide is carried out by the formation of a base associated with reduction of a nitrate ion to a nitrite ion. In the case where a photosensitizing dye is present in the solution during the formation process, an —OH group on the surface of zinc oxide and a functional group (a sulfonic acid group in the case of a phthalocyanine dye) of the dye form a chemical bond, whereby zinc oxide is grown and simultaneously modified with the dye molecules. The adsorption of the dye dominantly occurs on the (002) plane, and as a result, zinc oxide on the (002) plane is suppressed from growing but is grown in the (100) direction. As a result, the porous photovoltaic layer of zinc oxide adsorbing the dye can be produced.

The concentration of the zinc nitrate aqueous solution may be in a range of about from $1 \times 10^{-2}$ to 1 mole/L, and preferably from 0.1 to 0.5 mole/L. The concentration of the dye in the aqueous solution may be in a range of about from $1 \times 10^{-6}$ to $1 \times 10^{-4}$ mole/L, and preferably about $3 \times 10^{-5}$ mole/L.

The porous photovoltaic layer of zinc oxide adsorbing a photosensitizing dye can be produced in such a manner, for example, in that 0.5 $\mu$mole/L of a zinc phthalocyanine dye is dissolved in a zinc nitrate solution of 0.1 mole/L, and a solution is heated to 70° C., followed by reacting at a reduction electrolytic potential of −0.7 V (vs. SCE) for 60 minutes.

The reaction temperature may be in a range of from 0 to 100° C. Outside the range, there is such tendencies that the growing rate of zinc oxide is too high at a higher temperature, whereas it is too low at a lower temperature, so as to deteriorate the adhesiveness of zinc oxide on the substrate and the light transmissibility. Therefore, the reaction is preferably carried out at the foregoing temperature range. Upon reacting at a reduction electrolytic potential of from −0.7 to −1.3 V (vs. SCE), the porous photo-semiconductor electrode adsorbing the dye can be produced. When the potential is lower than the range, zinc plating occurs, whereas when it is higher than the range, no reaction occurs. Therefore, the reaction is preferably carried out in the foregoing potential range.

Examples of the counter electrode used in the electrochemical method include platinum, gold, silver, graphite and zinc. In the case where a porous photovoltaic layer of zinc oxide is to be produced, when metallic zinc is used as the counter electrode, fluctuation of the zinc concentration in the zinc nitrate aqueous solution can be suppressed, and decrease in pH of the solution due to the formation of zinc oxide can be suppressed, so as to carry out the production in a stable manner.

The electrochemical method can be carried out by the two-electrode method or the three-electrode method. Examples of a reference electrode for the three-electrode method include an SCE (a saturated calomel electrode), an NHE (a normal hydrogen electrode), an RHE (a reversible hydrogen electrode with a hydrogen pressure) and an NCE (a normal calomel electrode).

The electroconductive layer supported between the porous photovoltaic layer 3 and the support on a counter electrode side 20 is constituted with an electroconductive material. Materials that can transport an electron, a hole or an ion, and among these, a hole transporting layer 6 using a hole transporting material is preferred. The hole transporting layer will be described in detail later.

In order to prevent decomposition of the dye, such a production method may be employed in that the second porous semiconductor layer is produced before adsorbing the dye on the first semiconductor layer, and then the dyes are adsorbed on the respective layers. In this case, a dye A is adsorbed by forming a film on the surface of the metallic oxide of the first layer (layer A) or the second porous semiconductor layer (layer B), and then the dye on the particular layer is desorbed by removing the film, followed by adsorbing a dye B. In other words, a film is formed on the surface of the first layer (layer A) or the second layer (layer B) of semiconductor particles, and then a dye A is adsorbed to the film. Then, another dye B is adsorbed after the dye A adsorbed to at least the film has been removed by removing the film.

While the particles are used for forming the film in the foregoing procedure, it may be formed by carrying out hydrolysis on the surface of the particles to be coated by using a colloid solution or a metallic alkoxide. In these cases, the layer A after the formation is immersed in a metallic alkoxide aqueous solution to hydrolyze the metallic alkoxide with titanium oxide particles of the layer A to carry out modification, followed by baking, whereby the surface is coated. By adding ethanol to the metallic alkoxide aqueous solution used herein, the surface tension is lowered to efficiently infiltrate into the porous film.

The material to be coated may be any oxide that is dissolved in an acidic solution or basic solution. Specific examples for the case where an acidic solution is used include magnesium oxide, zinc oxide, copper oxide, nickel oxide molybdenum oxide, and specific examples for the case where a basic solution is used include zinc oxide, niobium oxide and lead oxide.

The acidic solution and the basic solution, in which the oxide is dissolved, are not particularly limited, and those that can dissolve the oxide may be used. As the acidic solution, those having an anion after dissolution that is evaporated upon baking are preferred, and specifically hydrochloric acid and sulfuric acid are preferred. Examples of the basic solution include sodium hydroxide and potassium hydroxide. The concentration of the solution used is preferably from 0.2 to 2 N (N: normality) while influenced by the dissolution time and the dye used.

The method for forming the second porous semiconductor layer will be described. The first porous semiconductor layer is coated by the ordinary doctor blade method and baked at 500° C. (layer A). Thereafter, magnesium oxide particles are mixed and dispersed in a titanium oxide suspension to prepare a suspension, which is then coated on the first porous semiconductor layer by using a doctor blade to form a film, followed by drying and baking, whereby the second porous semiconductor layer (layer B) is formed. In order to dissolve the magnesium oxide particles in the acidic suspension, it is possible that magnesium oxide is formed as a layer on the surface of titanium oxide of the layer B. Thereafter, a dye A is adsorbed on titanium oxide in the layer A, and the dye A is adsorbed on magnesium oxide in the layer B. Thereafter, magnesium oxide is dissolved by treating with hydrochloric acid, and as a result, the dye on the layer B is removed.

A dye B is then adsorbed, whereby the porous photovoltaic layer having a two-layer structure containing the layer B having the dye B and the layer A having the dye A can be produced.

There is a possibility that the dye of the second layer penetrates in the first porous photovoltaic layer. In this case, the dye can be removed by the washing step, but no problem arises even though the dye remains. In the case where the dye of the second porous photovoltaic layer remains, as a result of the formation of the second porous photovoltaic layer after forming the first porous photovoltaic layer, the dyes of the respective porous photovoltaic layers penetrate in each other at the interface between the first porous photovoltaic layer and the second porous photovoltaic layer, but no problem arises even though about 10% of the adsorbed amounts of the dyes are mixed. The interface between the first porous photovoltaic layer and the second porous photovoltaic layer may be formed with a steep gradient.

In the invention, as the photosensitizing dye adsorbed on the surface of the porous semiconductor layers, various kinds of dyes having absorption in the visible light region and/or the infrared light region may be used. For example, those having absorption in the visible light region and the infrared light region may be used. Examples thereof include ruthenium pyridine dyes, azoic dyes, quinone dyes, quinoneimine dyes, quinacridone dyes, squalirium dyes, cyanine dyes, merocyanine dyes, triphenylmethane dyes, xanthene dyes, porphyrin dyes, phthalocyanine dyes, perylene dyes, indigo dyes naphthalocyanine dyes and the like.

In the invention, in order that the dye and the semiconductor are firmly adsorbed on each other, it is preferred to use dyes containing, in the dye molecule, an interlock group such as a carboxyl group, a sulfonic group, an ester group, a mercapto group, a phosphonyl group and the like.

In order that light of a wide wavelength region is effectively utilized, it is important to use different kinds of dyes. It is preferred that the dye adsorbed on the first porous photovoltaic layer and the dye adsorbed on the second porous photovoltaic layer have maximum absorption wavelengths that are different from each other. Representative examples of the combination of dyes include a combination of a phthalocyanine dye having an absorption wavelength of from 630 to 800 nm and a perylene dye having an absorption wavelength of from 450 to 600 nm.

As a method for adsorption of the dyes, such a method can be used in that the porous semiconductor layer is immersed in a solution containing the dye. Examples of a solvent dissolving the dye include alcohols such as ethanol, ketones such as acetone, ethers such as diethyl ether and tetrahydrofuran, aliphatic hydrocarbons such as acetonitrile, aromatic hydrocarbons such as benzene, esters such as ethyl acetate, and water. Mixed solvents of these solvents may also be used without problem. The concentration of the dye in the dye solution is appropriately adjusted depending on the kinds of the dye and solvent used, and for example, it is adjusted to have a photosensitizing dye concentration of about $1\times10^{-5}$ mole/L or more, and preferably a photosensitizing dye concentration of about from $5\times10^{-5}$ to $1\times10^{-2}$ mole/L. Adsorption of the dye is preferably carried out by placing the dye solution and the porous semiconductor layer in the same airtight container and circulating the dye solution in the container, and may also be carried out only by simply immersing the porous semiconductor layer in the dye solution under atmospheric pressure for about from 5 minutes to 96 hours.

The support on a counter electrode side 20 is constituted by a substrate 7 and a counter electrode layer 8. The material used for the substrate 7 is not particularly limited as similar to the substrate 1, and it can be various kinds of transparent materials, with glass being preferably used. The material used for the counter electrode layer 8 is also not particularly limited, and one of a platinum thin film, a carbon thin film, fluorine-doped tin oxide ($SnO_2$:F), antimony-doped tin oxide ($SnO_2$:Sb), tin-doped indium oxide ($In_2O_3$:Sn), aluminum-doped zinc oxide (ZnO:Al) and gallium-doped zinc oxide (ZnO:Ga), an accumulated layer of plurality thereof, and a composite film of plurality thereof are preferably used. Examples of the method for forming the counter electrode film 8 on the substrate 7 include a vacuum vapor deposition method, a sputtering method, a CVD method and a PVD method using a component of the material, and a coating method by a sol-gel method.

In the invention, as the hole transporting layer 6 filled between the porous semiconductor layer 3 having the photosensitizing dye adsorbed thereon formed on the electroconductive support 10 and the support on a counter electrode side 20, materials that can transport an electron, a hole or an ion can be used. For example, a hole transporting material such as polyvinyl carbazole, an electron transporting material such as tetranitrofluorenone, an electroconductive polymer such as polypyrrole, a liquid electrolyte, and an ionic electroconductive material such as a polymer solid electrolyte, can be used.

Examples of the liquid ionic electroconductive material include an iodine ionic electroconductive material formed by dissolving tetrapropylammonium iodide and iodine in a solvent such as acetonitrile, and an iodine ionic electroconductive material formed by dissolving lithium iodide, iodine and dimethylpropylimidazolium iodide in a solvent such as 3-methoxyproponitrile.

The solid electrolyte is a solid substance that can dissolve a redox species or can be bonded to at least one substance constituting a redox species, and examples thereof include a polymer compound and a crosslinked product thereof, such as polyethylene oxide, polypropylene oxide, polyethylene succinate, poly-β-propiolactone, polyethylene imine and polyalkylene sulfide, a polymer obtained by adding a polyether segment or an oligoalkylene oxide structure as a side chain to a polymer functional group, such as polyphosphazene, polysiloxane, polyvinyl alcohol, polyacrylic acid and polyalkylene oxide, and a copolymer thereof. Among these, a polymer having an oligoalkylene oxide structure as a side chain and a polymer having a polyether segment as a side chain are preferred.

In order to contain the redox species in the solid, for example, a method of polymerizing a monomer constituting the polymer in the presence of the redox species can be used, and after dissolving a solid, such as a polymer compound, in a solvent depending on necessity, the redox species may be added. The content of the redox species can be appropriately selected corresponding to the necessary ionic conductivity.

The sealant 9 may be such a material that can seal the dye-sensitized solar cell to prevent the hole transporting layer 6 from leakage and is not particularly limited. For example, an epoxy resin, a silicone resin and a thermoplastic resin may be used. In the case where a solid material is used as the hole transporting layer 6, and there is no possibility of leakage of the hole transporting layer, the sealant 9 may not necessarily used.

The dye-sensitized solar cell of the invention is provided according to the foregoing constitution.

Figure 4:
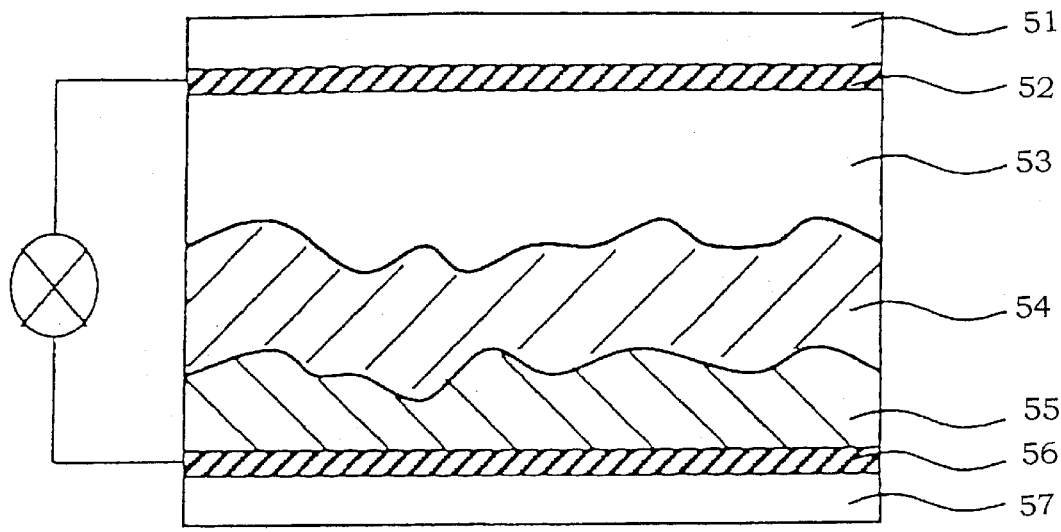
FIG. 4 is a cross sectional view showing an embodiment of a solar cell utilizing a dye-sensitized photovoltaic cell according to the invention.

The photovoltaic cell of the invention can be applied to devices such as a solar cell, an optical switching device, a sensor and the like. According to the invention, for example, a solar cell shown in FIG. 4 is provided. In FIG. 4, numeral 51 denotes a support (substrate), 52 denotes a transparent electroconductive film, 53 denotes an electroconductive material, 54 denotes a second porous photovoltaic layer, 55 denotes a first porous photovoltaic layer, 56 denotes a transparent electroconductive film, and 57 denotes a support (substrate). In this structure, the counter electrode means the combination of the support 51 and the transparent electroconductive film 52, and the electroconductive support means the transparent electroconductive film 56 and the support 57. In this structure, the counter electrode may not be transparent. The first porous photovoltaic layer contains a photosensitizing dye having a maximum sensitivity wavelength region (absorption spectrum) on a short wavelength side in comparison to the second porous photovoltaic layer. In the solar cell shown in FIG. 4, the side of the transparent electroconductive film 56 and the support 57 is the light receiving surface.

The effect of the invention can be obtained when the side of the counter electrode is used as the light receiving surface in such a manner that a transparent material is used as the support 51, and the second porous photovoltaic layer contains a photosensitizing dye having a maximum sensitivity wavelength region on a short wavelength side in comparison to the first porous photovoltaic layer. However, as shown in FIG. 4, a higher photovoltaic efficiency can be obtained when the side of the electroconductive support is used as the light receiving surface since the electroconductive layer does not intervene between the light receiving surface and the photovoltaic layer.

When the photovoltaic cell shown in FIG. 4 is irradiated with sunlight, the dye in the porous photovoltaic layer is excited by absorbing the light. Since the porous photovoltaic layer has the first porous photovoltaic layer and the second porous photovoltaic layer, a wide range of the spectrum in the spectrum of sunlight can be subjected to photovoltaic conversion. Electrons generated by the excitation migrate to the semiconductor layer constituting the porous photovoltaic layer and then further migrate to the counter electrode through the transparent electroconductive electrode. In the solar cell, on the other hand, holes remaining in the dye receive electrons from the counter electrode through the redox species in the electrolyte and are resumed to be the dye. An electric current flows through the process, and light energy is continuously converted to electric energy.

EXAMPLES

The invention will be further described in detail with reference to the following example, but the invention is not construed as being limited thereto.

The following examples and comparative examples will be described based on FIG. 1.

FIG. 1 is a schematic cross sectional view showing an important part of an photovoltaic cell of the invention for showing the layer structure. In FIG. 1, numeral 1 denotes a transparent support (transparent substrate), 2 denotes a transparent electroconductive film, 3 denotes a porous semiconductor layer, 4 denotes a first porous photovoltaic layer, 5 denotes a second porous photovoltaic layer, 6 denotes a redox electrolyte (carrier transporting layer), 7 denotes a counter electrode (substrate), 8 denotes a platinum film (counter electrode layer), and 9 denotes a sealant. The counter electrode 7 and the platinum film 8 form a support on a counter electrode side 20.

Example 1

125 ml of titanium isopropoxide (produced by Kishida Chemical Co., Ltd., purity: 99%) was added dropwise to 750 ml of a 0.1 M nitric acid aqueous solution (produced by Kishida Chemical Co., Ltd.) to carry out hydrolysis, and it was heated to 80° C. for 8 hours to obtain a sol liquid. Thereafter, it was maintained in a titanium autoclave at 250° C. for 15 hours to grow particles, followed by subjecting to ultrasonic dispersion for 30 minutes, whereby a colloid solution containing titanium oxide particles having a primary average particle diameter of 20 nm was obtained.

The resulting colloid solution containing titanium oxide particles was slowly condensed on an evaporator until the concentration of titanium oxide became 10% by weight, and then polyethylene glycol (produced by Kishida Chemical Co., Ltd., weight-average molecular weight: 200,000) was added thereto (addition amount: 40% by weight based on the titanium oxide), followed by stirring for dispersing the titanium oxide particles, so as to obtain a suspension.

An $SnO_2$ film as a transparent electroconductive film 2 was formed on a glass substrate 1, and the titanium oxide suspension thus prepared was coated on the side of the transparent electroconductive film 2 of the glass substrate 1 by a doctor blade method to obtain a coated film having an area of about 10 mm×10 mm. The coated film was preliminarily dried at 120° C. for 30 minutes and further baked under an oxygen atmosphere at 500° C. for 30 minutes, so as to form a titanium oxide film having a thickness of about 10 μm to be a first porous semiconductor layer of the first porous photovoltaic layer 4.

The first porous semiconductor layer had a haze ratio of 13%.

4.0 g of commercially available titanium oxide fine particles (TITANIX JA-1, a trade name, produced by Tayca Corp., particle diameter: about 180 nm) and 0.4 g of magnesium oxide powder (produced by Kishida Chemical Co., Ltd.) were put in 20 ml of distilled water, and pH was adjusted to 1 with hydrochloric acid. Furthermore, zirconia beads were added thereto, and the mixture was dispersed for 8 hours in a paint shaker. Thereafter, polyethylene glycol (produced by Kishida Chemical Co., Ltd., weight-average molecular weight: 200,000) was added thereto in an amount of 40% by weight based on the titanium oxide, followed by stirring, so as to obtain a suspension having titanium oxide particles dispersed therein.

The titanium oxide suspension thus prepared was coated by a doctor blade method on the first porous semiconductor layer of the glass substrate 1 having the titanium oxide layer as the first porous semiconductor layer. The resulting coated film was preliminarily dried at 80° C. for 20 minutes and further baked under an oxygen atmosphere at about 500° C. for 60 minutes, so as to form a titanium oxide film having a thickness of about 22 μm to be a second porous semiconductor layer of the second porous photovoltaic layer 5.

The second porous semiconductor layer had a haze ratio of 84%.

A merocyanine dye represented by the following formula (1) as a photosensitizing dye having a maximum sensitivity absorption wavelength region on a short wavelength side in the absorption spectrum (first dye) was dissolved in ethanol to prepare an absorption dye solution of the first dye having a concentration of $4\times10^{-4}$ mole/L.

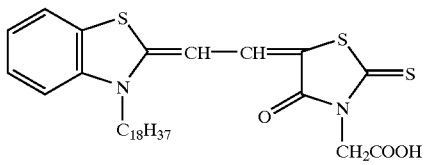

(1)

The glass substrate 1 having the transparent electroconductive film 2 and the porous semiconductor layer 3 was immersed in the absorption dye solution of the first dye heated to about 50° C. for 10 minutes to adsorb the first dye on the porous semiconductor layer 3. Thereafter, it was washed several times with absolute ethanol and dried at about 60° C. for about 20 minutes.

Subsequently, the glass substrate 1 was immersed in 0.5 N hydrochloric acid for about 10 minutes and washed with ethanol to desorb the first dye adsorbed on the second porous semiconductor layer. Furthermore, the glass substrate 1 was dried at about 60° C. for about 20 minutes.

A phthalocyanine dye represented by the following formula (2) as a photosensitizing dye having a maximum sensitivity absorption wavelength region on a long wavelength side in the absorption spectrum (second dye) was dissolved in dimethylformamide to prepare an absorption dye solution of the second dye having a concentration of $4 \times 10^{-4}$ mole/L.

The glass substrate 1 having the porous semiconductor layer 3 having the first dye and the second dye adsorbed thereon and the support on a counter electrode side 20 formed with ITO and glass having platinum as a counter electrode layer 8 were arranged in such a manner that the side of the porous semiconductor layer 3 and the side of platinum facing each other, and the redox electrolyte thus prepared was charged in a gap between them. The circumferences of the substrates were sealed with a sealant 9 of an epoxy resin to complete a dye-sensitized solar cell.

When the resulting solar cell was evaluated under the measurement conditions of AM-1.5 (100 mW/cm$^2$), the electric current value was 12.2 mA/cm$^2$, the open-circuit voltage (Voc) was 0.62 V, the fill factor (FF) was 0.71, and the energy conversion efficiency ($\eta$) was 5.4%.

Comparative Example 1

A solar cell was produced in the same manner as in Example 1 except that the same particles as in the first porous semiconductor layer were used in the second porous semiconductor layer. The porous photovoltaic layer had a haze ratio of 15%. As a result of measurement under the measurement conditions of AM-1.5, the electric current value was 10.1 mA/cm$^2$, the open-circuit voltage (Voc) was 0.61 V, the fill factor (FF) was 0.72, and the energy conversion efficiency ($\eta$) was 4.4%. The dye-sensitized solar cell having plural semiconductor layers having different particle diameters produced according to the invention effectively used irradiated light to increase photovoltaic current.

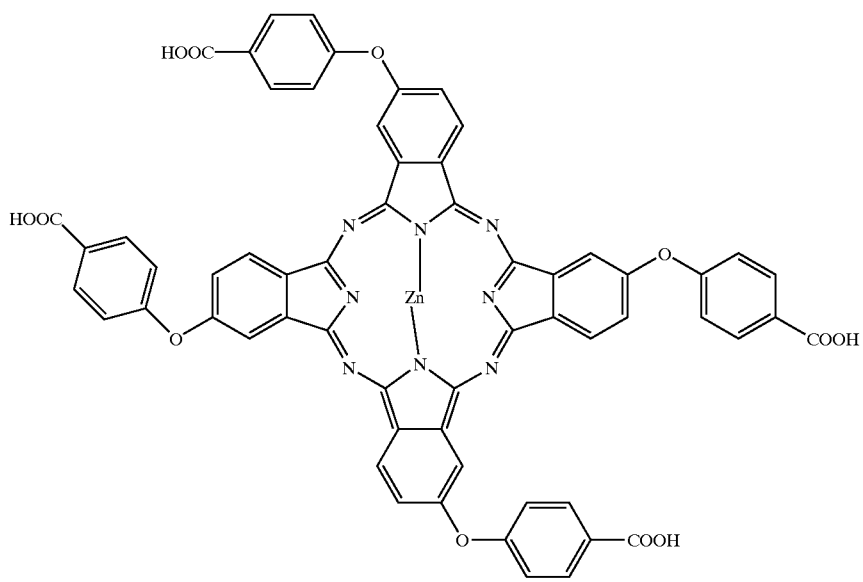

(2)

The glass substrate 1 having the transparent electroconductive film 2 and the porous semiconductor layer 3 was immersed in the absorption dye solution of the second dye for 15 minutes at room temperature to adsorb the second dye on the porous semiconductor layer 3. Thereafter, the glass substrate 1 was washed several times with absolute ethanol and dried at about 60° C. for about 20 minutes.

In 3-methoxypropionitrile as a solvent, dimethylpropylimidazolium iodide in a concentration of 0.5 mole/L, lithium iodide in a concentration of 0.1 mole/L and iodine in a concentration of 0.05 mole/L were dissolved to prepare a redox electrolyte.

Example 2

A first porous semiconductor layer was produced in the same manner as in Example 1.

As a production method of a second porous semiconductor layer, 125 ml of titanium isopropoxide (produced by Kishida Chemical Co., Ltd., purity: 99%) was added dropwise to 750 ml of a 0.1 M nitric acid aqueous solution (produced by Kishida Chemical Co., Ltd.) to carry out hydrolysis, and it was heated to 80° C. for 8 hours to obtain a sol liquid. Thereafter, it was maintained in a titanium autoclave at 250° C. for 15 hours to grow particles, followed by subjecting to ultrasonic dispersion for 30 minutes, whereby a colloid solution containing titanium oxide particles having a primary average particle diameter of 20 nm was obtained (titanium oxide A).

The resulting colloid solution containing titanium oxide particles was slowly condensed on an evaporator until the concentration of titanium oxide became 10% by weight, and then commercially available titanium oxide fine particles (TITANIX JA-1, a trade name, produced by Tayca Corp., particle diameter: about 180 nm, addition amount: 20% by weight based on the titanium oxide A), polyethylene glycol (produced by Kishida Chemical Co., Ltd., weight-average molecular weight: 200,000, addition amount: 40% by weight based on the titanium oxide A) and magnesium oxide powder (produced by Kishida Chemical Co., Ltd., addition amount: 8% by weight based on the total amount of titanium oxide) were added thereto, followed by stirring for dispersing the titanium oxide particles, so as to obtain a suspension. A film was formed on the first porous semiconductor layer by using the suspension thus prepared by a doctor blade method, and the coated film was preliminarily dried at 80° C. for 20 minutes and further baked under an oxygen atmosphere at about 500° C. for 60 minutes, so as to form the porous semiconductor layer 3. The porous semiconductor layer 3 had a thickness of 21 μm.

The porous semiconductor layer 3 had a haze ratio of 87%.

A dye-sensitized solar cell was produced in the same manner as in Example 1. When the resulting solar cell was evaluated under the measurement conditions of AM-1.5, the electric current value was 13.1 mA/cm$^2$, the open-circuit voltage (Voc) was 0.62 V, the fill factor (FF) was 0.70, and the energy conversion efficiency (η) was 5.7%.

Example 3

After producing the first porous semiconductor layer in the same manner as in Example 2, titanium oxide particles having a particle diameter of about 180 nm were added to the titanium oxide A in an amount of 1% by weight upon forming the second porous semiconductor layer. A solar cell was prepared in the same manner as in Example 2 except for the foregoing procedure. The results of the evaluation of the solar cell thus obtained are shown in Table 1 below.

Example 4

The same procedure as in Example 3 was repeated except that titanium oxide particles having a particle diameter of about 180 nm were added to the titanium oxide A in an amount of 5% by weight upon forming the second porous semiconductor layer. A solar cell was prepared in the same manner as in Example 2 except for the foregoing procedure. The results of the evaluation of the solar cell thus obtained are shown in Table 1 below.

Example 5

The same procedure as in Example 3 was repeated except that titanium oxide particles having a particle diameter of about 180 nm were added to the titanium oxide A in an amount of 10% by weight upon forming the second porous semiconductor layer. A solar cell was prepared in the same manner as in Example 2 except for the foregoing procedure. The results of the evaluation of the solar cell thus obtained are shown in Table 1 below.

Example 6

The same procedure as in Example 3 was repeated except that titanium oxide particles having a particle diameter of about 180 nm were added to the titanium oxide A in an amount of 15% by weight upon forming the second porous semiconductor layer. A solar cell was prepared in the same manner as in Example 2 except for the foregoing procedure. The results of the evaluation of the solar cell thus obtained are shown in Table 1 below.

Example 7

The same procedure as in Example 3 was repeated except that titanium oxide particles having a particle diameter of about 180 nm were added to the titanium oxide A in an amount of 16% by weight upon forming the second porous semiconductor layer. A solar cell was prepared in the same manner as in Example 2 except for the foregoing procedure. The results of the evaluation of the solar cell thus obtained are shown in Table 1 below.

Example 8

The same procedure as in Example 3 was repeated except that titanium oxide particles having a particle diameter of about 180 nm were added to the titanium oxide A in an amount of 18% by weight upon forming the second porous semiconductor layer. A solar cell was prepared in the same manner as in Example 2 except for the foregoing procedure. The results of the evaluation of the solar cell thus obtained are shown in Table 1 below.

TABLE 1

|  | Haze ratio (%) | Jsc (mA/cm$^2$) | Voc (V) | FF | η (%) |
| --- | --- | --- | --- | --- | --- |
| Example 3 | 17 | 10.2 | 0.61 | 0.71 | 4.4 |
| Example 4 | 22 | 10.4 | 0.61 | 0.72 | 4.5 |
| Example 5 | 36 | 10.3 | 0.61 | 0.71 | 4.5 |
| Example 6 | 54 | 10.5 | 0.62 | 0.71 | 4.7 |
| Example 7 | 62 | 11.0 | 0.62 | 0.70 | 4.8 |
| Example 8 | 71 | 11.4 | 0.62 | 0.70 | 4.9 |
| Example 2 | 87 | 13.1 | 0.62 | 0.70 | 5.7 |

The relationship between the haze ratio and Jsc in Examples 2 to 8 is shown in FIG. 2.

It is understood from the results that Jsc is increased when the haze ratio is increased, and particularly, the increase of Jsc becomes conspicuous in the samples having a haze ratio of 60% or more. It has been evidenced that by using the porous photovoltaic layer having a multi-layer structure having a controlled haze ratio, Jsc can be increased to improve the efficiency.

Example 9

125 ml of titanium isopropoxide (produced by Kishida Chemical Co., Ltd.) was added dropwise to 750 ml of a 0.1 M nitric acid aqueous solution (produced by Kishida Chemical Co., Ltd.) to carry out hydrolysis, and it was heated to 80° C. for 8 hours to obtain a sol liquid. Thereafter, it was maintained in a titanium autoclave at 250° C. for 10 hours to grow particles, followed by subjecting to ultrasonic dispersion for 30 minutes, whereby a colloid solution containing titanium oxide particles having a primary average particle diameter of 15 nm was obtained.

The resulting colloid solution containing titanium oxide particles was condensed on an evaporator, and then a solution formed by dissolving ethyl cellulose (produced by Kishida Chemical Co., Ltd.) and terpineol (produced by Kishida Chemical Co., Ltd.) in ethanol was added thereto, followed by stirring for dispersing the titanium oxide particles, so as to obtain a suspension (titanium oxide A).

The concentrations were adjusted to make a concentration of titanium oxide of 15% by weight, a concentration of ethyl cellulose of 10% by weight and a concentration of terpineol of 64% by weight.

An $SnO_2$ film as a transparent electroconductive film 2 was formed on a glass substrate 1, which was a transparent support, and the titanium oxide suspension thus prepared was coated on the side of the transparent electroconductive film 2 of the glass substrate 1 by a screen printing method to obtain a coated film having an area of about 10 mm×10 mm. The coated film was preliminarily dried at 120° C. for 30 minutes and further baked under an oxygen atmosphere at 500° C. for 60 minutes, so as to form a first porous semiconductor layer having a thickness of about 13 μm.

The first porous semiconductor layer had a haze ratio of 11%.

Commercially available titanium oxide particles (AM 600, a trade name, produced by Tayca Corp., anatase form, average primary particle diameter: 30 nm, addition amount: 20% by weight based on the titanium oxide A) and magnesium oxide powder (produced by Kishida Chemical Co., Ltd., addition amount: 8% by weight based on the total amount of titanium oxide) were added to the foregoing suspension to prepare a suspension.

The titanium oxide suspension thus obtained was coated as a second porous semiconductor layer by a screen printing method on the first porous semiconductor layer. The resulting coated film was preliminarily dried at 120° C. for 30 minutes and further baked under an oxygen atmosphere at about 500° C. for 60 minutes, so as to form the second porous semiconductor layer. As a result, the porous semiconductor layer 3 had a total thickness of 27 μm.

The second porous semiconductor layer had a haze ratio of 88%.

A photosensitizing dye represented by the following formula (3) was used as a photosensitizing dye having a maximum sensitivity absorption wavelength region on a short wavelength side in the absorption spectrum (first dye).

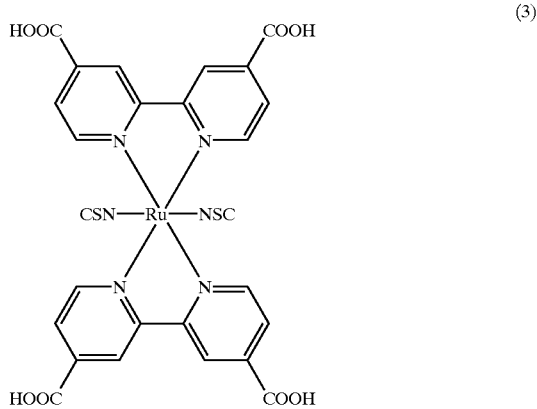

(3)

The dye was dissolved in ethanol in a concentration of $4\times10^{-4}$ mole/L to produce an absorption dye solution of the first dye. The resulting absorption dye solution and the porous semiconductor layer 3 were placed in a container, and the dye was adsorbed by heating and permeating at about 50° C. for 10 minutes. Thereafter, it was washed several times with absolute ethanol and dried at about 60° C. for about 20 minutes.

The porous film having the dye adsorbed thereon was immersed in 0.5 N hydrochloric acid for about 10 minutes, and then it was washed several times with absolute ethanol to desorb the first dye from the porous film and dried at about 60° C. for about 20 minutes.

A phthalocyanine dye represented by the formula (2) was used as a photosensitizing dye having a maximum sensitivity absorption wavelength region on a long wavelength side in the absorption spectrum (second dye).

The dye was dissolved in dimethylformamide in a concentration of $4\times10^{-4}$ mole/L to produce an absorption dye solution of the second dye. The resulting absorption dye solution and the titanium oxide porous semiconductor layer 3 were placed in a container, and the dye was adsorbed by permeating for about 15 minutes. The other conditions were room temperature and ordinary pressure. Thereafter, it was washed several times with absolute ethanol and dried at about 60° C. for about 20 minutes.

Glass having ITO as a counter electrode 7 was arranged in such a manner that platinum 8 and the porous semiconductor film 3 face each other, and a redox electrolyte 6 was charged in a gap between them. The circumferences of the substrates were sealed with a sealant 9 of an epoxy resin to complete a dye-sensitized solar cell. The redox electrolyte used was produced by dissolving dimethylpropylimidazolium iodide in a concentration of 0.5 mole/L, lithium iodide in a concentration of 0.1 mole/L and iodine in a concentration of 0.05 mole/L in 3-methoxypropionitrile as a solvent.

When the resulting solar cell was evaluated under the measurement conditions of AM-1.5, the electric current value was 14.2 $mA/cm^2$, the open-circuit voltage (Voc) was 0.64 V, the fill factor (FF) was 0.70, and the energy conversion efficiency (η) was 6.4%.

Example 10

After producing the first porous semiconductor layer according to Example 1, the dye represented by the formula (3) was adsorbed thereon to obtain the first porous photovoltaic layer. The first porous semiconductor layer had a haze ratio of 11%. A second porous photovoltaic layer formed with zinc oxide was produced by an electrodeposition method.

In the first porous photovoltaic layer thus formed on the transparent electroconductive film, a lead wire was attached to the transparent electroconductive film and connected to a work electrode of a potentiostat. On the counter electrode, a lead wire from a platinum plate counter electrode was connected, and a saturated calomel electrode as a reference electrode was connected to the reference. The assembly was then placed in a container formed with an electrononconductive material of glass. An aqueous solution containing zinc nitrate in a concentration of $5\times10^{-4}$ mole/L and the dye represented by the formula (2) in a concentration of $4\times10^{-4}$ mole/L was placed in the container.

The temperature inside the container was set at 70° C., and an electrolytic potential of −0.7 V (vs. SCE) was applied with a stabilized power supply. A porous zinc oxide layer having the dye represented by the formula (2) adsorbed thereon was formed on the transparent electroconductive film through an electrolytic reaction for 60 minutes, whereby a second porous photovoltaic layer was produced. The second porous photovoltaic layer had a thickness of 8 μm, and the porous photovoltaic layer had a thickness of 18 μm. The average particle diameter on the surface of the second porous photovoltaic layer was about 300 nm. It was then washed with ethanol and placed in a dryer set at 60° C. for 15 minutes to dry the second porous photovoltaic layer. As a result of the measurement of the haze ratio of the porous semiconductor layer, it was 89%.

A solar cell was prepared in the same manner as in Example 1. When the resulting solar cell was evaluated under the measurement conditions of AM-1.5, the electric current value was 11.5 mA/cm$^2$, the open-circuit voltage (Voc) was 0.61 V, the fill factor (FF) was 0.71, and the energy conversion efficiency ($\eta$) was 5.0%.

Example 11

Both the first and the second layers were produced by the electrodeposition method according to the production method of the second porous semiconductor layer shown in Example 10.

The first porous photovoltaic layer was produced in the manner shown in Example 10 except that the dye represented by the formula (3) was used. The first porous photovoltaic layer had a thickness of 8 $\mu$m and a haze ratio of 48%.

The second porous photovoltaic layer was produced on the first porous photovoltaic layer in the same manner as in the production of the first porous photovoltaic layer, provided that the phthalocyanine dye represented by the formula (2) was used as the dye. The production was carried out with other steps and constitutional materials that were the same as in the production of the first porous photovoltaic layer, so as to obtain the second porous photovoltaic layer according to the invention. The total thickness of the first layer and the second porous photovoltaic layer was 16 $\mu$m.

The second porous photovoltaic layer had a haze ratio of 51%.

A solar cell was prepared in the same manner as in Example 1. When the resulting solar cell was evaluated under the measurement conditions of AM-1.5, the electric current value was 11.1 mA/cm$^2$, the open-circuit voltage (Voc) was 0.58 V, the fill factor (FF) was 0.68, and the energy conversion efficiency ($\eta$) was 4.4%.

Example 12

The first porous photovoltaic layer was produced according to the production method in Example 11.

On the first porous photovoltaic layer, the second porous photovoltaic layer was produced by using a hydrothermal method. Tetrabutoxytitanium was dissolved in 50 ml of an ethanol solution in a concentration of 0.1 mole/L to obtain a mixed solution. 20 ml of water and 0.3 g of hydrochloric acid as a catalyst were added thereto, and the mixture was stirred for 30 minutes at room temperature. Thereafter, a part of the mixed solution was taken out, and 2.5 g of polyethylene glycol having a molecular weight of 20,000 was added thereto, followed by stirring at room temperature for 30 minutes. The solution having polyethylene glycol added and the remaining solution were mixed to obtain a sol. The sol was coated on the substrate by a dip coating method and dried at 90° C. for 1 hour. The substrate was then immersed in warm water at 97° C. for 1 hour and then dried at 80° C. for 30 minutes to obtain a titanium oxide film.

The second porous photovoltaic layer had a thickness of 4 $\mu$m and a haze ratio of 54%.

Separately, the phthalocyanine dye represented by the formula (2) was dissolved in ethanol to produce a photosensitizing dye solution having a concentration of 5×10$^{-4}$ mole/L. The second porous photovoltaic layer was immersed in the solution to carry out adsorption of the dye at 60° C. for 60 minutes, and then it was washed several times with ethanol, followed by drying at 60° C. for 15 minutes.

A solar cell was prepared in the same manner as in Example 1. When the resulting solar cell was evaluated under the measurement conditions of AM-1.5, the electric current value was 10.1 mA/cm$^2$, the open-circuit voltage (Voc) was 0.61 V, the fill factor (FF) was 0.65, and the energy conversion efficiency ($\eta$) was 4.0%.

What is claimed is:

1. A dye-sensitized photovoltaic cell comprising:
   an electroconductive support,
   a porous photovoltaic layer comprising a porous semiconductor layer containing a photosensitizing dye,
   a hole transporting layer,
   a counter electrode, and
   wherein the porous photovoltaic layer comprises a multi-layer structure, and the semiconductor layer of the porous photovoltaic layer has a haze ratio at a wavelength in a visible light region of 60% or more.

2. A dye-sensitized photovoltaic cell as claimed in claim 1, wherein semiconductors of respective layers of the porous photovoltaic layer have a multi-layer structure and have different particle diameters.

3. A dye-sensitized photovoltaic cell as claimed in claim 1, wherein the porous photovoltaic layer having a multi-layer structure comprises particles having different particle diameters that are sequentially increased from a light receiving surface.

4. A dye-sensitized photovoltaic cell as claimed in claim 1, wherein in the porous photovoltaic layer having a multi-layer structure, the porous photovoltaic layer on a side of a light receiving surface has a uniform particle diameter.

5. A dye-sensitized photovoltaic cell as claimed in claim 1, wherein the porous photovoltaic layer having a multi-layer structure comprises layers arranged in an order, from a light receiving surface, from a layer having a maximum sensitivity wavelength region on a short wavelength side in the absorption spectrum to a layer having a maximum sensitivity wavelength region on a long wavelength side in the absorption spectrum.

6. A dye-sensitized photovoltaic cell comprising:
   an electroconductive support,
   a porous photovoltaic layer comprising a porous semiconductor layer containing a photosensitizing dye, the porous photovoltaic layer having a multi-layer structure,
   a hole transporting layer,
   a support on a counter electrode side, and
   wherein semiconductors of respective layers of the porous photovoltaic layer having a multi-layer structure have different particle diameters.

7. A dye-sensitized photovoltaic cell as claimed in claim 6, wherein the porous photovoltaic layer having a multi-layer structure comprises particles having different particle diameters that are sequentially increased from a light receiving surface.

8. A dye-sensitized photovoltaic cell as claimed in claim 6, wherein in the porous photovoltaic layer having a multi-layer structure, the porous photovoltaic layer on a side of a light receiving surface has a uniform particle diameter.

9. A dye-sensitized photovoltaic cell as claimed in claim 6, wherein the porous photovoltaic layer having a multi-layer structure comprises layers arranged in an order, from a light receiving surface, from a layer having a maximum sensitivity wavelength region on a short wavelength side in the absorption spectrum to a layer having a maximum sensitivity wavelength region on a long wavelength side in the absorption spectrum.

10. A process for producing a dye-sensitized photovoltaic cell comprising an electroconductive support, a porous photovoltaic layer having a multi-layer structure containing a photosensitizing dye provided on the electroconductive support, an electroconductive layer, and a support on a counter electrode side, a second and subsequent photovoltaic layers from a light receiving surface being formed at a temperature of 200° C. or less.

11. A process for producing a dye-sensitized photovoltaic cell as claimed in claim 10, wherein the second and subsequent photovoltaic layers are formed by an electrodeposition method.

12. A process for producing a dye-sensitized photovoltaic cell as claimed in claim 11, wherein a porous photovoltaic layer having a water soluble dye adsorbed on a surface thereof is formed by the electrodeposition method using a metallic inorganic salt solution containing the water soluble dye.

13. A process for producing a dye-sensitized photovoltaic cell as claimed in claim 11, wherein an electrolytic potential in the electrodeposition method is in a range of from −0.7 to −1.3 V (vs. SCE).

14. A process for producing a dye-sensitized photovoltaic cell as claimed in claim 11, wherein the electrodeposition method is carried out at a temperature in a range of from 0 to 100° C.

15. A process for producing a solar cell comprising a dye-sensitized photovoltaic cell comprising an electroconductive support, a porous photovoltaic layer having a multi-layer structure formed on the electroconductive support, an electroconductive layer, and a support on a counter electrode side, wherein the photovoltaic layer comprises at least one porous semiconductor layer and a dye, the process comprising:

the photovoltaic layer being produced by adsorbing a dye on particles and a film of the porous semiconductor layer, wherein the film of the porous semiconductor layer is provided at least partially over the particles of the porous semiconductor layer, removing the film of the porous semiconductor layer including the dye adsorbed thereon, and adsorbing another dye.

16. A process for producing a solar cell comprising a dye-sensitized photovoltaic cell comprising an electroconductive support, a porous photovoltaic layer having a multi-layer structure including at least one porous semiconductor layer and comprising a dye, and an electroconductive layer, the process comprising:

the photovoltaic layer being produced by adsorbing a dye on particles and a film of the porous semiconductor layer, wherein the film of the porous semiconductor layer is provided at least partially over the particles of the porous semiconductor layer, removing the film of the porous semiconductor layer including the dye adsorbed thereon, and adsorbing another dye.

17. A dye-sensitized photovoltaic cell comprising at least the following components in the following order:

an electroconductive support;

a porous photovoltaic layer having a two-layer structure and comprising a photosensitizing dye, wherein the two layers of the porous photovoltaic layer each comprise a semiconductor and a dye;

a carrier transport layer; and a support on a counter electrode side.

* * * * *